(12) United States Patent
Chetput et al.

(10) Patent No.: US 8,234,617 B2
(45) Date of Patent: Jul. 31, 2012

(54) METHOD AND SYSTEM FOR RE-USING DIGITAL ASSERTIONS IN A MIXED SIGNAL DESIGN

(75) Inventors: Chandrashekar L. Chetput, San Jose, CA (US); Abhijeet Kolpekwar, Round Rock, TX (US); Donald J. O'Riordan, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 342 days.

(21) Appl. No.: 12/571,726

(22) Filed: Oct. 1, 2009

(65) Prior Publication Data

US 2011/0083114 A1    Apr. 7, 2011

(51) Int. Cl.
*G06F 17/50* (2006.01)

(52) U.S. Cl. .......... 716/136; 716/106; 716/107
(58) Field of Classification Search .......... 716/106, 716/107, 136
See application file for complete search history.

(56) References Cited

U.S. PATENT DOCUMENTS

| | | | |
|---|---|---|---|
| 7,993,778 B2 * | 8/2011 | Yim et al. | 429/185 |
| 2002/0073380 A1 * | 6/2002 | Cooke et al. | 716/1 |

* cited by examiner

*Primary Examiner* — Vuthe Siek
(74) *Attorney, Agent, or Firm* — Vista IP Law Group, LLP

(57) ABSTRACT

A system, method, and computer program product is disclosed that recycle digital assertions for mixed-signal electronic designs. The approach enables the re-use of pure digital assertions which reference signals that turn out to resolve to analog due to the particular circuit configuration chosen during the verification process.

30 Claims, 12 Drawing Sheets

METHOD AND SYSTEM FOR RE-USING DIGITAL ASSERTIONS IN A MIXED SIGNAL DESIGN

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

The invention relates to the field of electrical design and verification.

BACKGROUND AND SUMMARY

Verification is an important step in the process of designing and creating an electronic product. Verification is usually performed at several stages of the electronic design process to ensure that the electronic design will work for its intended purpose. For example, after a designer has created an initial set of designs, the designer then tests and optimizes the design using a set of EDA (electronic design automation) testing and analysis tools.

Circuit designers and verification engineers use different methods to verify circuit designs. One common method of verification is the use of simulation. Simulation dynamically verifies a design by monitoring behaviors of the design with respect to test stimuli. Another method of verification is the use of model checking. Model checking statically verifies properties of a design by analyzing the state space of the design and determining whether a property holds in all reachable states. The properties to verify may be global properties involving signals in widely separated parts of the design, or they may be more local properties that pertain only to single or small number of related modules in the design.

Assertion Based Verification (ABV) is a powerful verification approach which has proven to help digital IC architects, designers, and verification engineers improve design quality and reduce time to market. Assertions are annotations in a design that perform built-in "checks" during verification of a circuit design, and which are often implemented as statements that describe expected design behavior. Assertions can be used for both property checking and simulation. For example, properties of a circuit design can be embedded in the design in the form of assertions for property checking approaches to verification.

Assertions can be entered by the circuit designer or added by a separate process. These assertions, which relate to either local or global properties, can be used to verify a design using dynamic and/or static techniques. When a simulator is applied to the design, the assertions can be extracted as part of a test bench and used in checking the circuit for assertion violations. When model checking is applied to the design, an assertion can serve as the basis for what is checked.

Assertions are written both during development of the design and the verification environment. Both designers and verification engineers can be involved in identifying requirements and capturing them as assertions.

A designer for a given block enables assertion-based verification of the block by locating or writing assertions that reflect the properties of the interface between that block and the rest of the design. The designer also documents as assertions any additional assumptions made about the interface as the block is implemented. Assertions can be written for important interactions that are expected to occur among sub-components of the block as well as assertions that prohibit predictable nominal functionality, boundary conditions, startup behavior, and predictable errors. The designers can also write assertions to create coverage points to ensure that known corner cases and complex areas of the design are verified. Designers can also verify their blocks using the assertions they have written about its behavior. In particular, designers can use formal analysis to verify that the block behaves correctly. They can also simulate, to test whether the block works correctly in common scenarios.

A verification engineer defines assertions and coverage points derived from the functional specification for the device. For example, a verification engineer might define assertions to ensure that the design is always in a valid configuration, that the design and the environment communicate correctly, that the environment drives the design inputs appropriately, and that the design responds correctly to its inputs. A verification engineer will also be concerned about measuring functional coverage, to ensure that the design is thoroughly verified. To that end, the verification engineer will define functional coverage points to check that the design has been verified in every valid configuration and that all possible variations in the communication protocol between design and environment have been verified. In addition, the verification will also define functional coverage points that check that all, or at least representative, valid combinations of inputs have been used in the verification and that all, or at least representative, valid combinations of outputs have been observed in the verification.

The issue being addressed by this application is the common practice by engineers of re-using prior designs, design files, and components when implementing new product designs, especially when those prior designs, files, and components include assertions that would also be introduced in the later designs based upon the re-use process. Design re-use is a very efficient way of implementing designs, since many new electronic designs include functionality and features that are identical or similar to functionality and features of prior designs. As a result, the design engineer can often work much more efficiently by using a prior design as a starting point rather than "recreating the wheel" and implementing the entire design from scratch. Moreover, many blocks and libraries in the prior design might have been created by domain experts who have specialties in the fields associated with those prior blocks and libraries. The design engineer seeking to implement a new design, even without being a domain expert in those areas, can re-use those prior blocks and libraries to implement a design that now takes advantage of prior the thinking and efforts of the domain experts in that technical space.

One problem is that the prior design that is being re-used may be purely digital in nature, but that prior design may be re-used and migrated to a new mixed signal design that includes both digital and analog components. For example, a block in the prior design that was purely digital may be re-implemented as an analog component block. To the extent the prior design of the block includes assertions, those assertions are implemented with the assumption of digital signals, i.e., with the expectation that signals are of binary "1" and "0" values. However, when one or more blocks in the design are redesigned to be analog in nature, the signals being received by the block having the assertion may now be electrical (continuous valued) in nature, without the clear existence of "1"

and "0" values. As a result, the re-use of that block in a new design with analog components could cause failure or errors when performing verification.

Another common scenario in verification of full chip designs is to switch some of the critical blocks from digital to analog for more accurate full chip verification. Such reconfiguration of blocks can result in a similar situation of possible failures or errors when performing mixed-signal verification.

There is no available solution in the current state of the art that addresses the need for direct re-use of digital assertions in the mixed-signal simulation. There can be some ad-hoc manual approaches in which designers tweak their models/designs in a manual way to make the digital assertions work correctly in a mixed-signal simulation environment. However, such approaches are disadvantageous because they are time-consuming, error-prone, and very much rely upon the ability of individual designers to have the skill and expertise to be able to make such tweaks.

Some embodiments of the invention addresses these scenarios, providing a system and method which enables the re-use of "pure digital" assertions which reference signals that turn out to resolve to analog due to the particular circuit configuration chosen during the verification process.

The present invention provides novel techniques to support re-using "digital assertions" to support mixed-signal simulation of designs. During mixed-signal simulation, the nets, signals and expressions used in the digital assertions can fully or partially become analog (continuous time domain) and need an analog simulator or a combination of digital and analog simulators to compute their values. The present invention is focused on re-use of digital assertions as-is, and as described in further detail in the detailed description and corresponding figures, some embodiments of the invention describe approaches for addressing the problem of allowing pure digital assertion to work, when any of the signals referenced within an assertion end up being represented by an "analog" or continuous valued quantity.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present invention is directed to a system, method, and computer program product which enables the re-use of pure digital assertions which reference signals that turn out to resolve to analog due to the particular circuit configuration chosen during the verification process.

Figure 1:
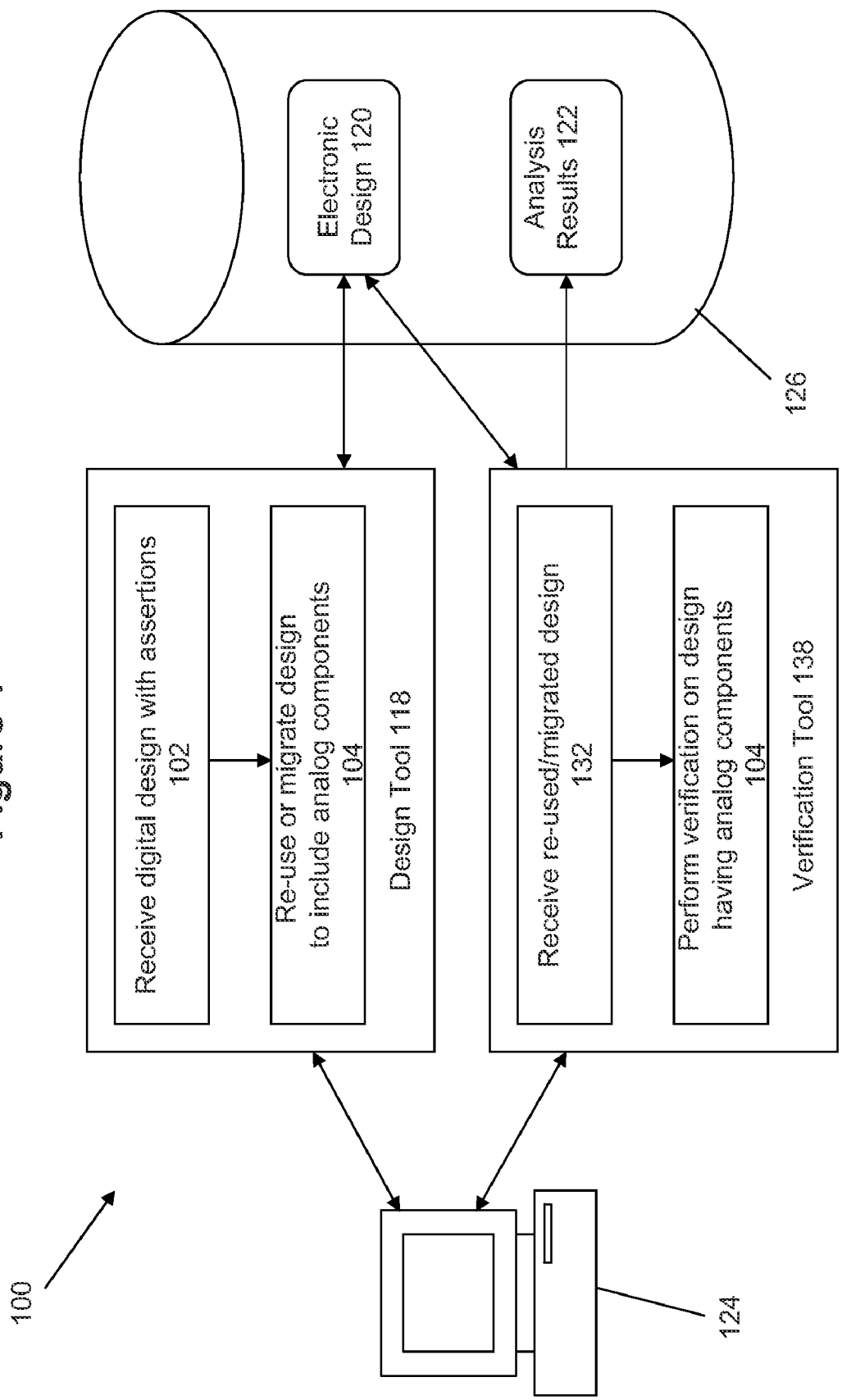
FIG. 1 illustrates an example system which may be employed in some embodiments of the invention to allow re-use of digital assertions into a mixed signal design.

FIG. 1 illustrates an example system 100 which may be employed in some embodiments of the invention to allow re-use of digital assertions into a mixed signal design. System 100 may include one or more users at one or more user stations 124 that operate the system 100 to design or verify electronic designs 120. Such users include, for example, design engineers or verification engineers. User station 124 comprises any type of computing station that may be used to operate, interface with, or implement EDA applications or devices. Examples of such user stations 124 include for example, workstations, personal computers, or remote computing terminals. User station 124 comprises a display device, such as a display monitor, for displaying processing results 122 to users at the user station 124. User station 124 also comprises input devices for user to provide operational control over the activities of system 100.

The electronic designs 120 may be stored in a computer readable storage device 126. Computer readable storage device 126 comprises any combination of hardware and software that allows for ready access to the data that is located at the computer readable storage device 126. For example, computer readable storage device 126 could be implemented as computer memory operatively managed by an operating system. The computer readable storage device 126 could also be implemented as an electronic database system having storage on persistent and/or non-persistent storage. According to the present embodiment, the electronic design 120 and analysis results 122 are placed into the computer readable storage device 126.

A design tool 118 may be used by users a user station 124 to create or edit electronic designs 120. The design tool 118 may also be used by users to receive existing pure digital designs (102) and to re-use or migrate the existing digital designs having assertions into mixed signal designs having both analog and digital components (104).

Verification may be performed upon electronic designs 120 using verification tool 138. To perform verification upon the migrated design, the migrated design having the re-used pure digital components is first received at the verification tool 138 (132).

As noted above, if the original pure digital design includes assertions, then there may be problems during verification if the prior pure digital design is being re-used into a new design that includes analog components. This is due to the non-digital nature of the signals that may be produced when there are analog components mixed with the digital components in the electronic design 120, and the possibly fatal or erroneous results that may occur when the pure digital assertions interact with such non-digital signals.

As an example scenario in which this may occur, consider System on Chip (SOC) designs that are created by electronics designers to implement functionality on integrated circuit (IC) chips. In many modern designs, even purely digital System on Chip (SOC) designs are eventually implemented in transistors, and a part of today's verification process calls for the design to be verified in regression tests in which different design configurations are used. In particular, many of these design configurations require swapping out of a digital block or sub-block and replacing it with a transistor level/SPICE counter part, and/or re-simulating the blocks in the presence of parasitic devices.

During these regression tests, it is desirable to reuse the same testbenches as for the purely digital representation. Such simulations should also be performed in the presence of power management circuitry (isolation, state retention cells, etc). Essentially, a significant step in the verification of digital IC's is to run a mixed signal simulation, in which parts of the IC are represented by analog quantities.

In certain situations however, conventional tools are not currently capable of fully supporting the digital Assertion Based Verification (ABV) methodology during the simulation of these essentially digital circuits in a mixed-signal context, since conventional ABV works reliably only for pure digital signal elements. When the expressions/properties in assertion statements reference signals which actually resolve to analog as different configurations of the design are specified, common behaviors with the current art are that "not supported" error messages are issued by the simulator and/or the simulator software program crashes or otherwise exits abruptly without running the simulation. Today's simulators simply cannot handle the case where analog objects are referenced in a digital assertion statement. This approach of resolving to analog is a common scenario when using the Verilog-AMS (Analog Mixed-Signal) language, and is solved for within the continuous domain, e.g., as unknowns in a system of simultaneous equations representing Kirchoffs Current Laws, as is often the case in SPICE-class and mixed signal simulators.

Systems 100 embodying the present invention address this problem to allow verification to be performed upon such migrated designs that include both digital and analog components (104). Embodiments of the present invention enable the re-use of pure digital assertions which reference signals that turn out to resolve to analog due to the particular circuit configuration chosen during the verification process. During mixed-signal simulation, the nets, signals and expressions used in the digital assertions can fully or partially become analog (continuous time domain) and need an analog simulator or a combination of digital and analog simulation algorithms to compute their values.

To illustrate the problem being addressed, consider the following example code written in the Verilog language that includes a digital-based assertion:

```
module top( );
foo i1 (a,b);
bar i2 (b,c);
// psl e_assumed_digital: assert
// always {a; b} |-> c;
endmodule
```

In this example, the module "top( )" is being configured to includes two elements/blocks "foo" and "bar". "foo" is associated with two signals "a" and "b". "bar" is associated with signals "b" and "c".

Lines in Verilog that begin with the "//" are normally ignored. However, assume that the syntax of assertion pragmas are configured with the phrase "//psl". The phrase "psl" refers to a standard language promulgated by the Accellera organization for property specification (more details of the Accellera language is available at www.accellera.org). When it is desired to run assertions, then these pragmas can be searched for and recognized as containing the assertion statements. Therefore, the logic for the assertion statement from the above Verilog snippet is the following:

always {a; b} |->c;

This statement specifies that when signal "a" equals TRUE (also known as a logic "high" value) and "b" also equals TRUE, then signal "c" must also be TRUE. In this example, "foo" and "bar" are assumed to be sub-components of "top." The assertion statement attempts to verify some property (e.g., a relationship among the constituent objects or signals) of the top level block. Thus, the assertion relates to an interaction when a certain sequence of events happens for signals "a" and "b", and expected sequence is supposed to follow (c goes to TRUE or logic high). The subcomponent (foo, bar) themselves are represented as instances i1 and i2.

The problem is that when this module is migrated to a new design, signals "a", "b", and/or "c" may end up being analog in nature. Therefore, these signals are electrical in nature and no longer have a binary "1" or "0" (or TRUE/FALSE) value, in which case the logic of the assertion statement will likely fail.

Embodiments of the present invention allows the immediate re-use of the same psi statement (or any other assertion flavor such as SVA (SystemVerilog)), in an "as-is" manner, without change or rewrite, even though any or all of the referenced signals "a", "b", or "c" are no longer modeled as digital values.

Figure 2:
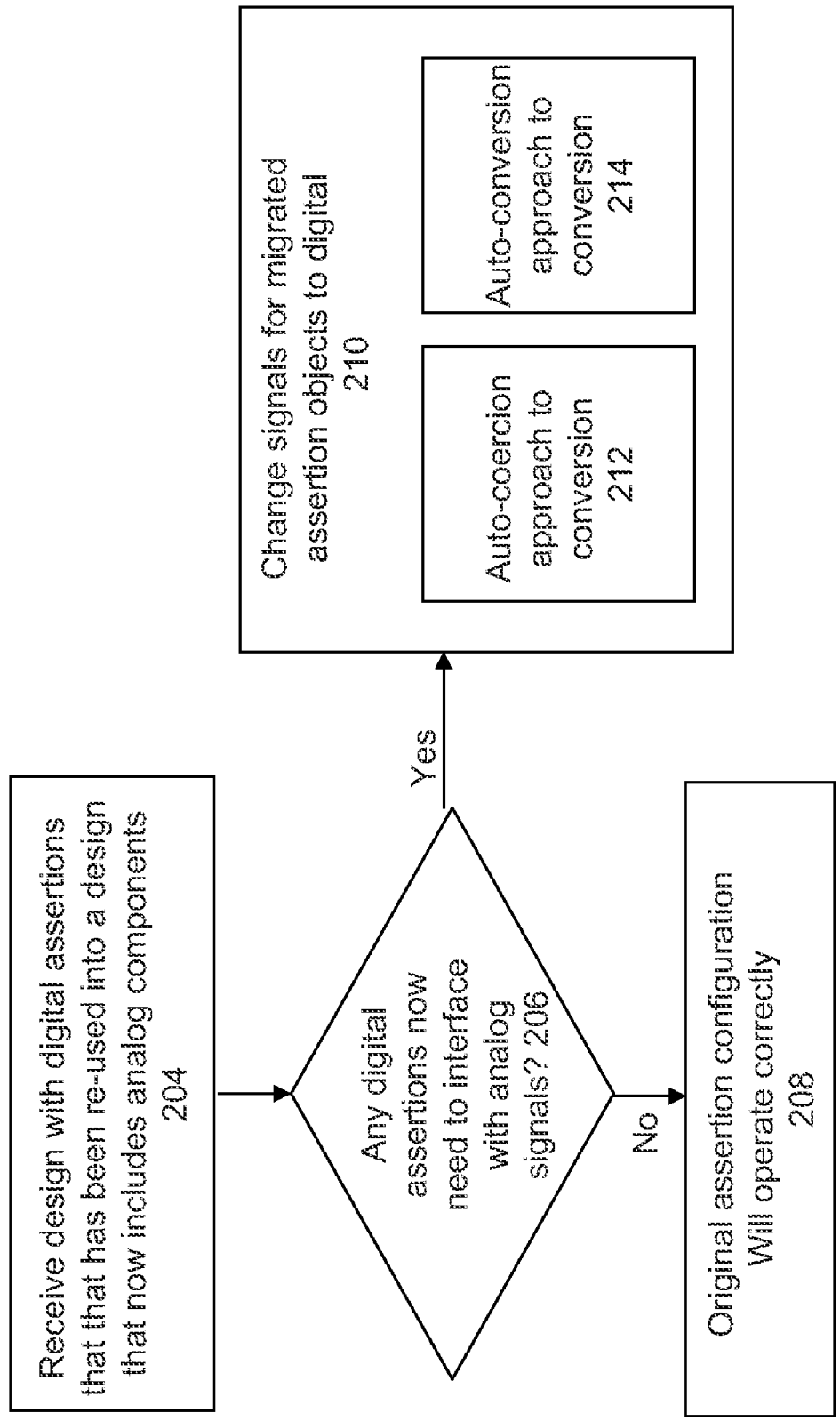
FIG. 2 shows a high level flow of a process for handling re-use of designs that include digital assertions.

FIG. 2 shows a high level flow of a process for handling re-use of designs that include digital assertions. At 204, the process receives a design with digital assertions that that has been re-used to generate a new design that now includes one or more analog components. For example, the new design could include a design configuration in which a block or sub-block that was originally digital in nature was replaced with a transistor level/SPICE counterpart.

Next, at 206, a determination is made whether or not any of the digital-based assertions now need to interface directly with analog-based signals/components. If not, then as stated at 208, the digital-based assertion will interface only with digital assertions and should still operate correctly.

If, however, there exists one or more digital-based assertions which interface with analog signals, then the process proceeds to 210 to change the analog nature of those signals into digital-based signals. According to some embodiments of the invention, there are at least two approaches that can be taken to change the analog signals to digital signals.

A first approach 212 is termed the "invasive" or "auto-coercive" approach. This approach performs automatic coercion of signals by typecasting them so that analog signals become digital in nature before they are addressed by any part of the simulator including that which processes the assertion(s). For example, for designs in the Verilog-AMS language, auto-coercion is performed which forces the referenced signals to be of a Verilog-AMS discrete discipline simply due to the fact that they are referenced in a digital context within an assert statement. Interface elements, such as Verilog-AMS Connect Modules, will be inserted accordingly in a fully automatic manner. The results of this coercion will ensure that for modules such as "top" in the above example, signals a, b and c can only be resolved to a discrete (digital) discipline during a simulator's elaboration process. This approach is applicable to blocks described using HDLs such as Verilog, VerilogAMS, System Verilog, or any variation, extension or derivative of Verilog.

A second approach 214 is termed the "non-invasive" or "auto-conversion" approach. This second approach automatically converts analog signal values to their corresponding digital representation, completely on-the-fly and only in the context of the evaluation of the assert statements. Such conversion is performed dynamically and transiently for assertion processing, and any other aspects of the simulator that need to access the corresponding signal values will continue receive the analog values. The result is that even if the signals "a" "b" or "c" for the above example resolve to analog signals, those signals will be temporarily converted to digital only when evaluating the assertion statement.

The distinction between the two approaches is that the auto-coercion approach causes a digital signal to actually be generated and sent towards the block containing the digital assertion. The coerced digital signal interfaces with the analog blocks using an Analog-Digital conversion module that is included into the circuit representation. In contrast, the auto-conversion approach assumes that an analog signal is actually being sent to the assertion. Since the incoming signal is analog, a contemporaneous conversion is performed "on-the-fly" to instantly convert the analog signal to a digital signal. The auto-coercion approach statically coerces a signal referenced in the assert statement to be digital—during design elaboration. The auto-conversion approach dynamically converts a signal which is referenced in the assert statement to be digital—during design simulation.

Rules may be established to implement and guide these conversion and coercion activities. Default rules may be utilized, in which the default rules are defined to determine which method to use for the conversion/coercion, and what are the appropriate threshold values or connect rules to use to enable domain conversion. User-defined rules may also be used in addition to, or instead of, the default rules. The default rules may be overridden by a user via an appropriate set of configuration options. As described below, portions of an analog control file can be used to specify these rules and thresholds. This could be an external (user created) or internal (auto generated) file.

Figure 3:
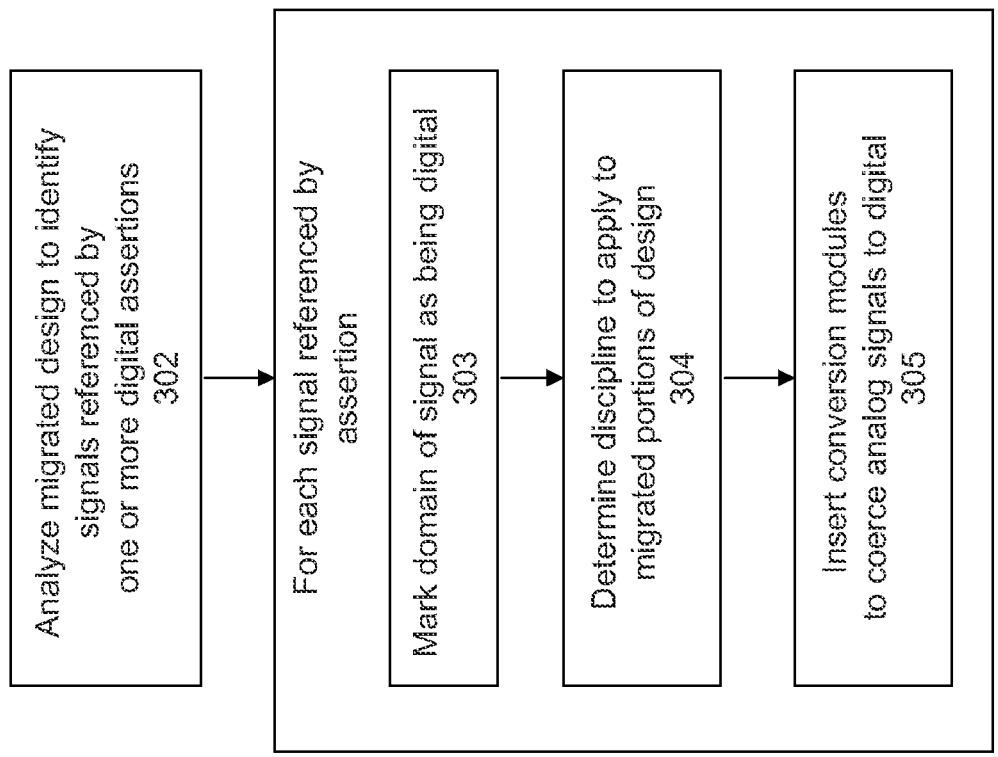
FIG. 3 shows a flowchart of a process for implementing the invasive/auto-coercive approach according to some embodiments of the invention.

FIG. 3 shows a flowchart of a process for implementing the invasive/auto-coercive approach according to some embodiments of the invention. At 302, the design is analyzed to identify the signals that are associated with or referenced by at least one digital assertion.

For each such signal, actions 303, 304, and 305 are performed. At 303, the domain of that signal is marked as being "digital." It is noted that each signal/component in the design may be associated with the digital domain, analog domain, or a "domain-less" category of domain. According to some embodiments, signals/components associated with the domain-less category default to being an analog signal for purpose of the present analysis.

At 304, the discipline of the signal will be determined. The term "discipline" refers to the identification of the parameters and settings that will be used when changing a signal from the analog domain to the digital domain. For example, one way to convert an analog signal to a digital signal is to establish threshold voltage levels at which the analog signal will be considered either "high" or "low". For a 3V signal, one may establish 1V as the threshold voltage at which a signal is to be considered a "low" digital value, e.g., when the voltage of the signal moves beneath 1V, then it is considered to have a digital value of "low" or "0". Similarly, one may establish 2V as the threshold voltage at which a signal is to be considered a "high" digital value, e.g., when the voltage of the signal moves above 2V, then it is considered to have a digital value of "high" or "1". Voltages levels that are in-between these threshold values do not cross these thresholds may be configured to retain the previous digital value. As described in more detail below, rules and block specifications may be employed to establish and configure the parameters for the various disciplines. According to some embodiments, the discipline of the signal can be determined by any appropriate technique. For example, the Verilog-AMS Discipline Resolution Algorithm may be used to set a discipline of a signal. Another variation would be to set a discipline using the approach described in U.S. Patent Publication No. 20080184181, filed on Jul. 31, 2008, entitled "Analog/digital partitioning of circuit designs for simulation", which is hereby incorporated by reference in its entirety.

Conversion modules are inserted into the design at 305. These conversion modules perform the task of converting an analog signal to a digital signal, e.g., based upon the voltage threshold levels established for the associated discipline of the signal. Any suitable conversion module format may be used. For example, for Verilog-AMS based designs, Connect Modules may be inserted across digital/analog boundaries using the standard set of protocols defined by the Verilog-AMS specification. Based upon the operation of the conversion module, the signal referenced in the assert statement will be coerced to be a digital signal when processed by the digital kernel. The operation of the connect module determines how that digital signal interfaces with its analog blocks.

Figure 4:
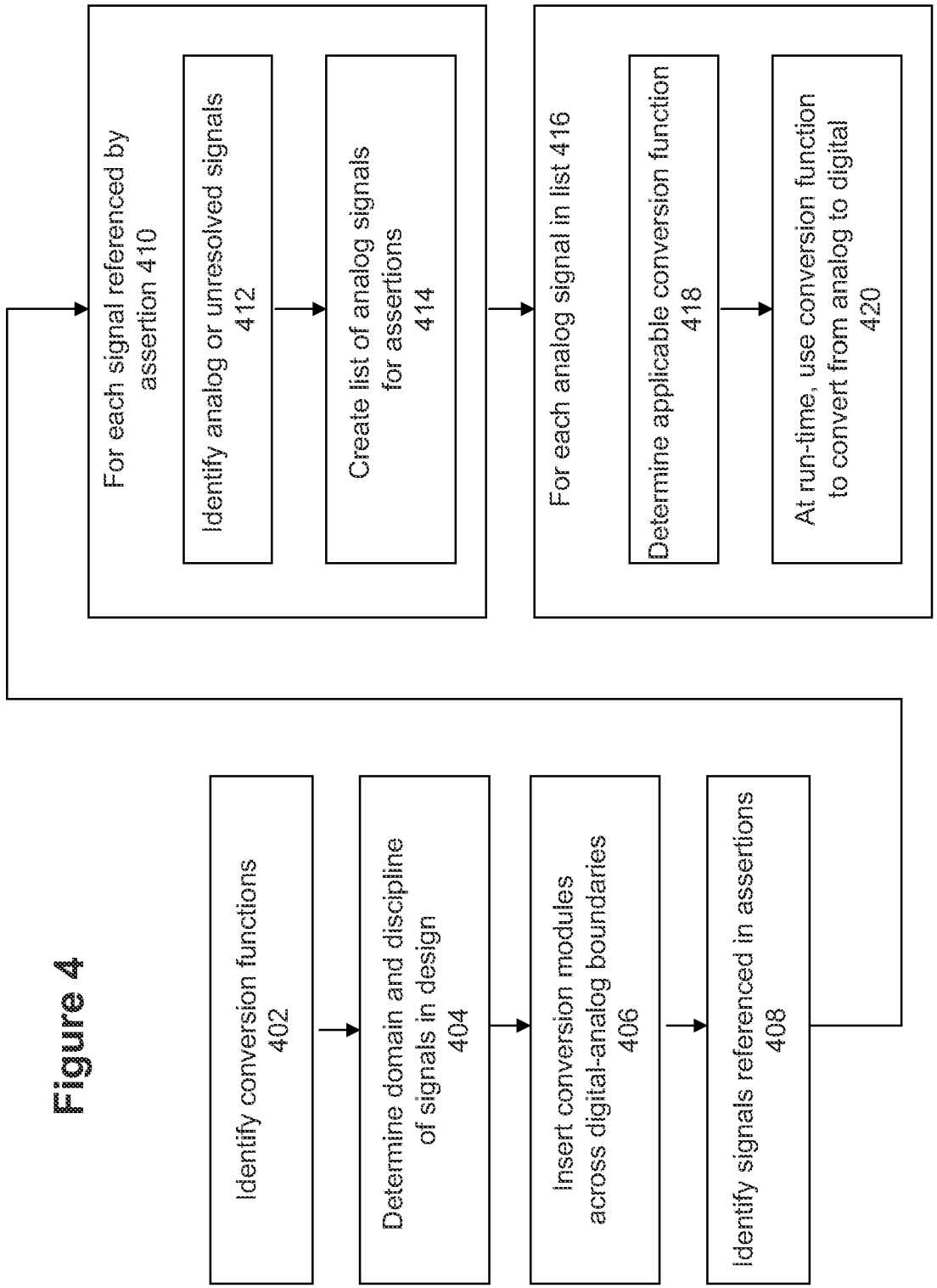
FIG. 4 shows a flowchart of a process for performing conversions based upon the non-invasive/auto-conversion approach according to some embodiments of the invention.

FIG. 4 shows a flowchart of a process for performing conversions based upon the non-invasive/auto-conversion approach according to some embodiments of the invention. At 402, a list of conversion functions are processed to identify the conversion function and the full hierarchical scope within which that conversion function is effective. An unique list of such functions is created, e.g., such as "scoped conversion functions". It is noted that implementation of this list can be proprietary in nature. The list of conversion functions may be specified by a user or supplied as default functions by an EDA tool.

Next, at 404, the process determines the domain and discipline of signal in the design, e.g., using the Verilog-AMS Discipline Resolution Algorithm or any other appropriate proprietary or non-proprietary technique, e.g., as described in U.S. Patent Publication No. 20080184181, filed on Jul. 31, 2008, entitled "Analog/digital partitioning of circuit designs for simulation", which is hereby incorporated by reference in its entirety. At 406, conversion modules are inserted across digital/analog boundaries, e.g., by inserting Connect Modules using the standard set of protocols defined by Verilog-AMS, or any other appropriate proprietary or non-proprietary technique such as described in U.S. Patent Publication No. 20080184181, filed on Jul. 31, 2008, entitled "Analog/digital partitioning of circuit designs for simulation", which is hereby incorporated by reference in its entirety. At this point, these conversion modules may result in signals referenced by digital-based assertions to interact with analog signals.

All signals referenced by the assertions are identified at 408. At 410, for every signal referenced in the assert statements, 412 and 414 are performed. Analog or unresolved signals are identified at 412. If the signal is either declared or resolved to be a digital signal, then nothing additional is performed for the present process, and the signal referenced in the assert statement will be processed by the digital kernel. However, if the signal is either declared or resolved to be an analog signal, then those signals are added to a list of signals identified to be analog signals. The present process will also determine the full hierarchical name and the scope of the signal reference.

At 416, for each analog signal in the list, 418 and 420 will be performed. At 418, the full hierarchical signal name and scope of the signal is used to determine the applicable conversion function from the list of conversion functions established at 402. Next, at 420, processing is set-up so that at run time, the identified conversion functions are used to convert the analog signal value to its equivalent digital value. Therefore, at run-time, any analog signal referenced in the assert statement will be set up to be converted to an equivalent digital value for use when processing the assert statements.

Note that 402, 408, 410 and/or 416 can be executed in any suitable ordering, e.g., executed together prior to both or either 404 and/or 406. Therefore, there can be variations in implementation of these actions within the scope of embodiments of the invention.

Illustrative Example

Figure 5:
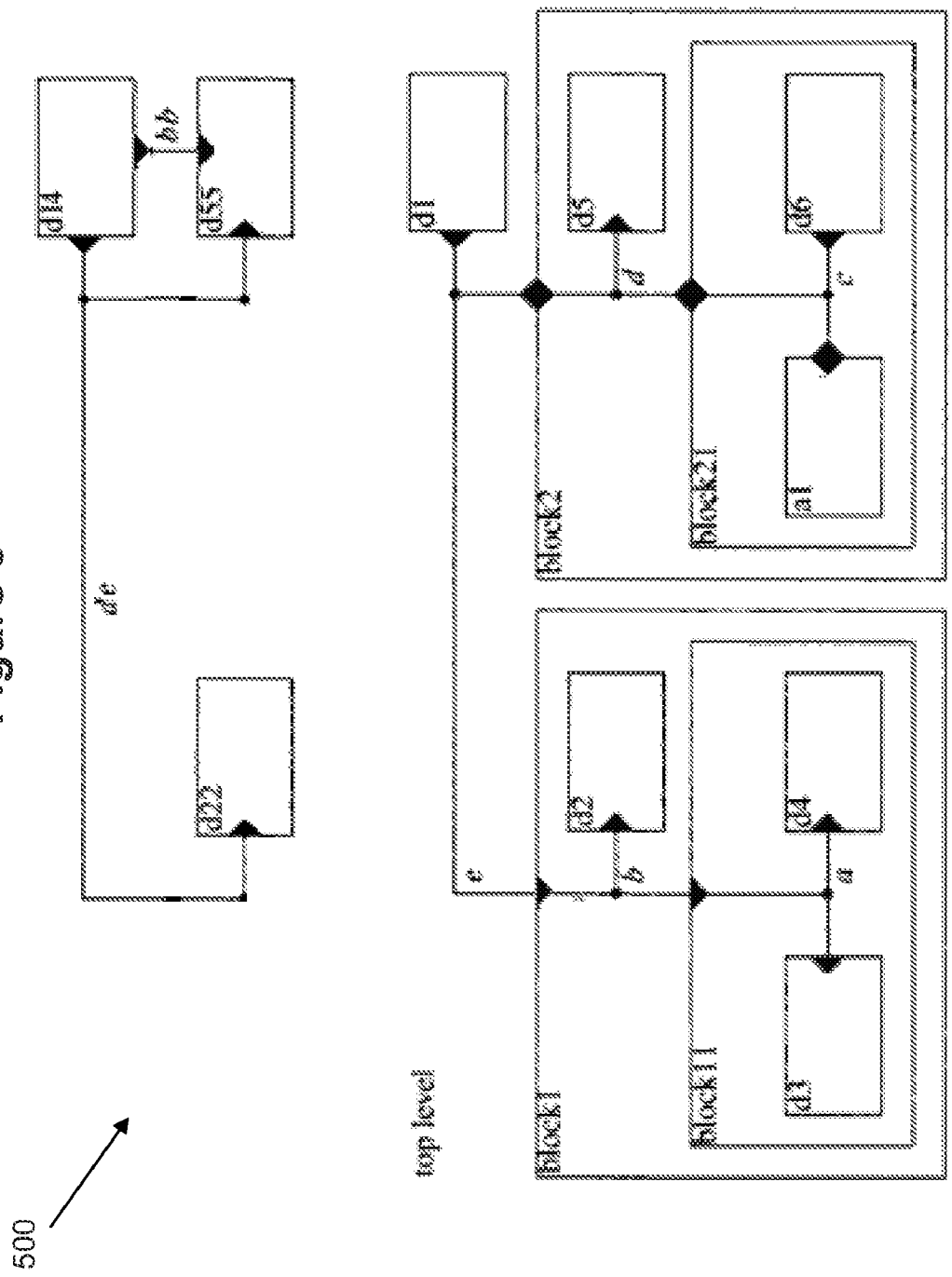
FIGS. 5-11 provide illustrated examples of a pure digital representation of an example design and the application of embodiments of the invention to that example design.

Illustrative examples will now be provided of embodiments of the invention. Consider the verification of a pure digital design, with the testbench and design as shown in FIG. 5. FIG. 5 shows a pure digital representation of an example design 500. Assume that the top level testbench as shown in FIG. 5 has three key design blocks (block 1, block 2, and block d1) as shown. There may also be some stimulus/observer or other blocks in the testbench such as blocks d22, d14, d55.

At the testbench level, there are three wires/signals of interest, notably de, bb, e. There may also be other signals connecting these blocks, which are irrelevant to the discussion at hand. Further assume that the blocks block1, block2, block11 and block21 are defined using pure structural code, e.g., the ports of these blocks are not explicitly assigned a discipline in Verilog-AMS.

At the testbench level, an assertion property may exist of the following form, which assumes that signals de, bb and e are purely digital:

```
// psl e_assumed_digital: assert
// always {de[=2]; bb} |-> e;
```

This assertion states that when signal de is equal to 2 and signal bb is TRUE, then signal e must be TRUE.

The assumption in the previous paragraph is based on how the signals are accessed in the Boolean layer of the Assert expression. In this context, they are used in extremely simple expressions. More complex expressions may include more intricate Boolean expressions.

Figure 6:
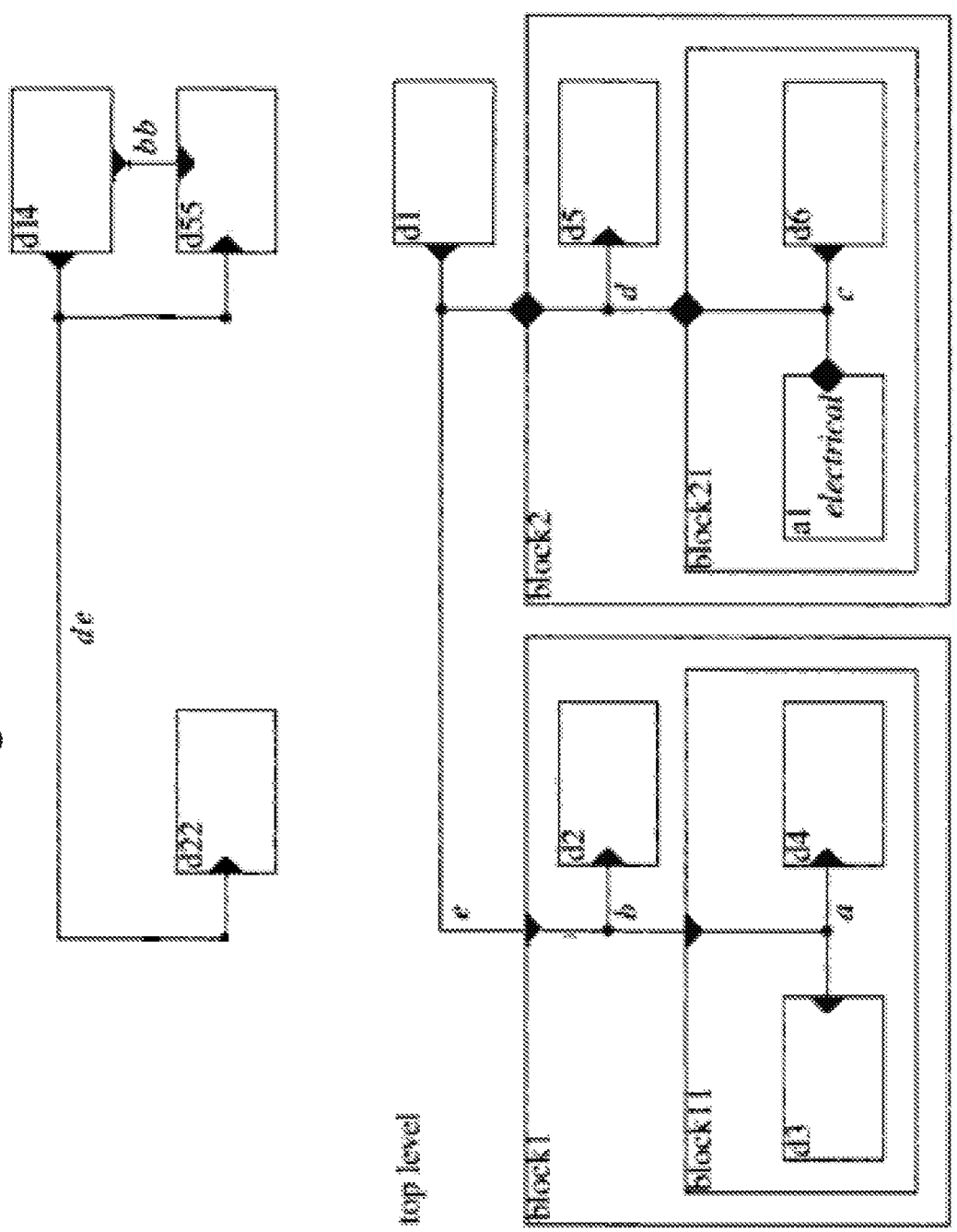

Assume that the design of FIG. 5 is re-used in a manner such that an analog component is introduced into the design. For example, assume that the design is modified so that the new design has an electrical representation for leaf-level block a1, as shown in FIG. 6.

The Verilog-AMS discipline resolution mechanism operates to propagate disciplines through the design, e.g., using a basic discipline resolution or detailed discipline resolution. More details regarding the Verilog-AMS discipline resolution mechanism is available in Chapter 7 of the Verilog-AMS language reference manual, which is available from www.eda.org/verilog-ams/htmlpages/public-docs/lrm/2.3/VAMS-LRM-2-3.pdf, which is hereby incorporated by reference in its entirety. Regardless of which resolution mechanism is used in this case, signal e in the top level will be resolved to the electrical discipline, which is of the continuous or "analog" domain. By stating that an object is "analog" or of the continuous domain, it is meant that its value is maintained or solved for in the continuous domain. Typically, though not always, this implies that the process of solving for the value of the analog object involves the construction and solution of a set of ordinary differential equations (such as those that represent Kirchoffs Current Law in a SPICE-class simulator) which represent a conservative system.

Figure 7:
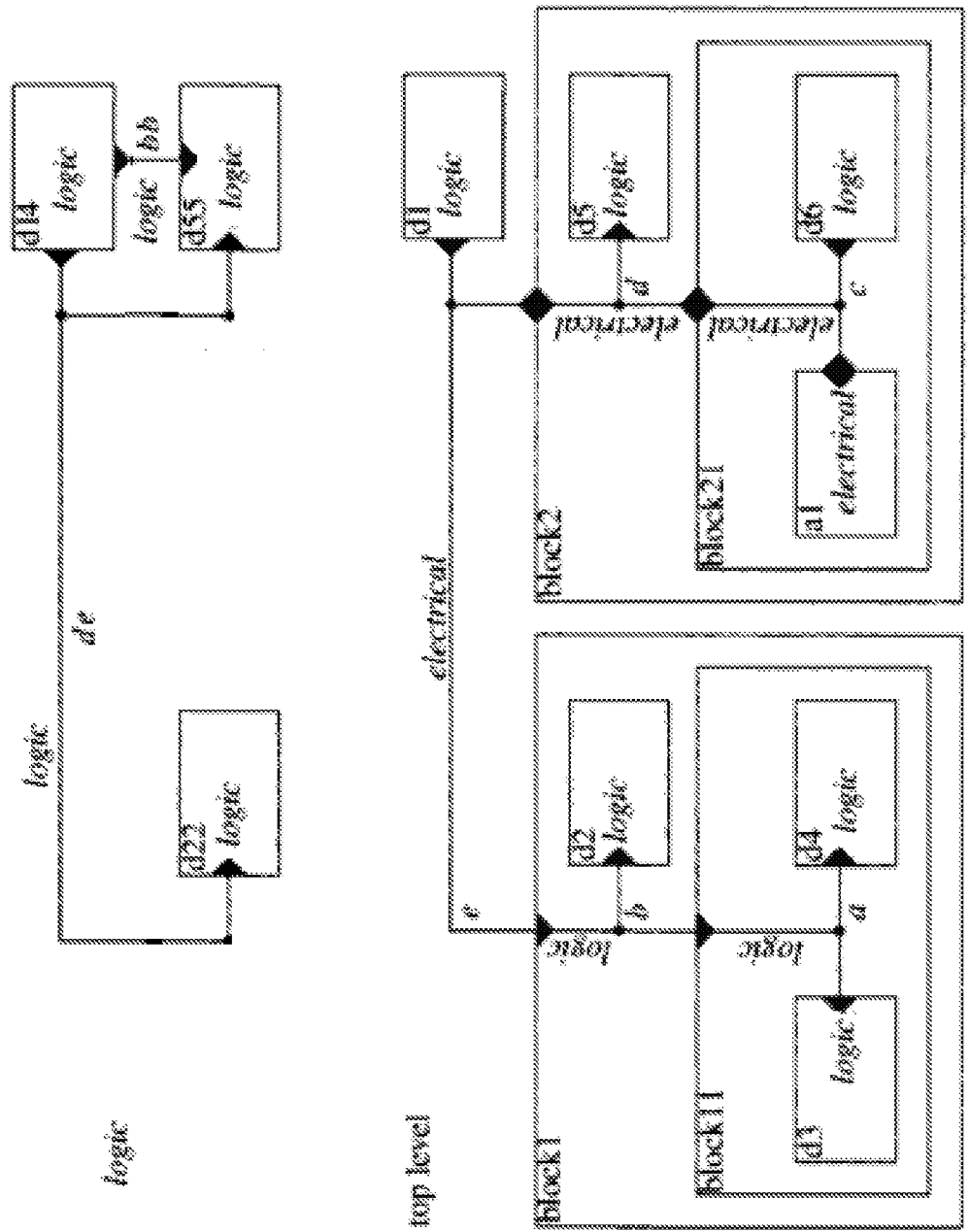
Figure 8:
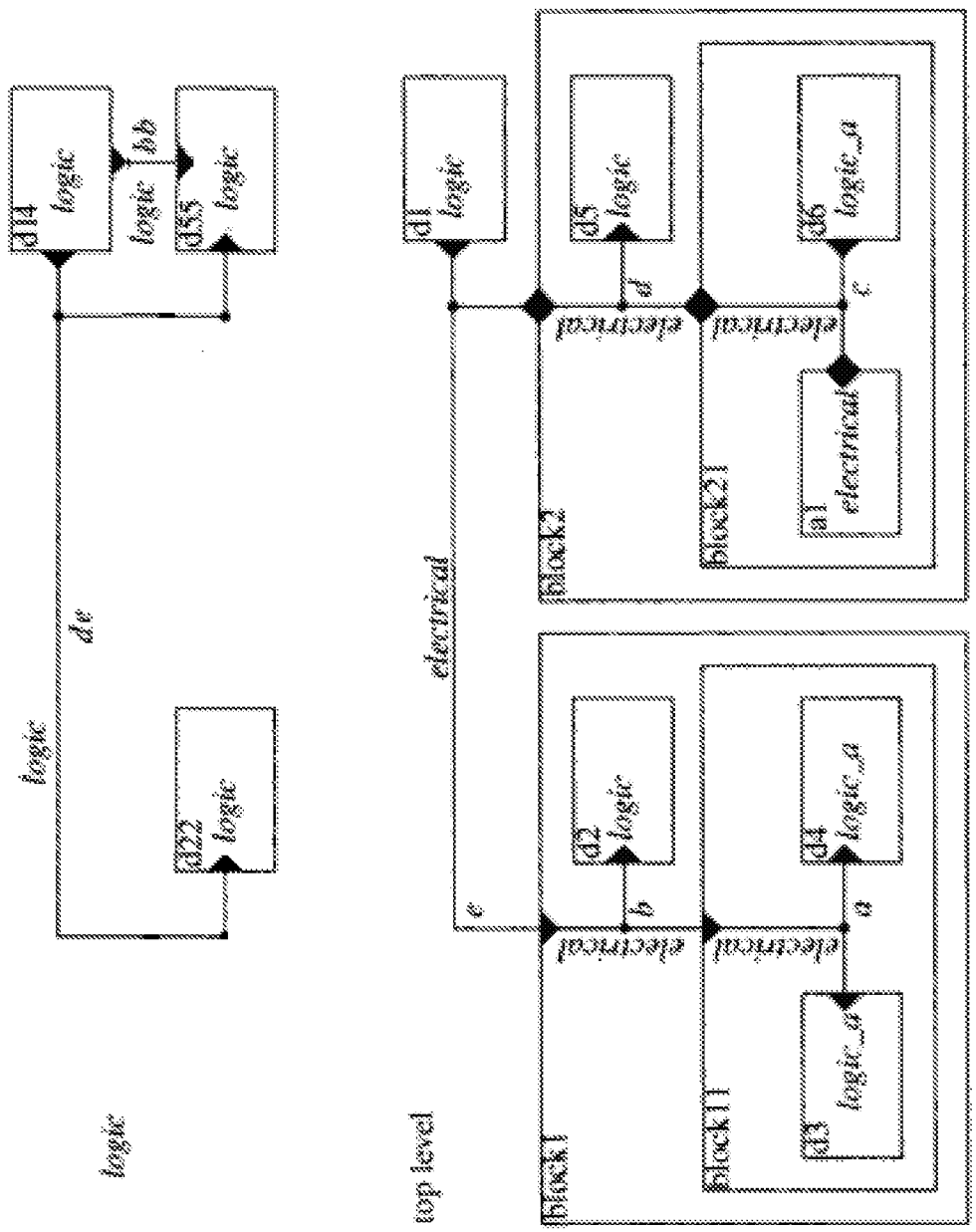

The result is that with the introduction of the electrical continuous domain at the leaf level component a1, signal e in the top level is now resolved to analog or continuous domain, while signals de and bb are still represented in the discrete (logic) domain. FIG. 7 shows an example of the result based upon the Verilog-AMS default discipline resolution approach. FIG. 8 shows an example of the result based upon the detailed discipline resolution approach.

In Verilog-AMS, the assert statement from above may now fail to operate correctly due to signal e being "analog", e.g., of the continuous domain.

```
// psl e_assumed_digital: assert
// always {de[=2]; bb} |-> e;
```

Embodiments of the present invention allow signal e to continue to be referenced in the assert statement, without any rewrite of the assert statement itself. In other words, the assert statement may be re-used as-is for all possible design configurations, with switching in and out of continuous (analog) representations of blocks and sub-blocks as desired.

Figure 9:
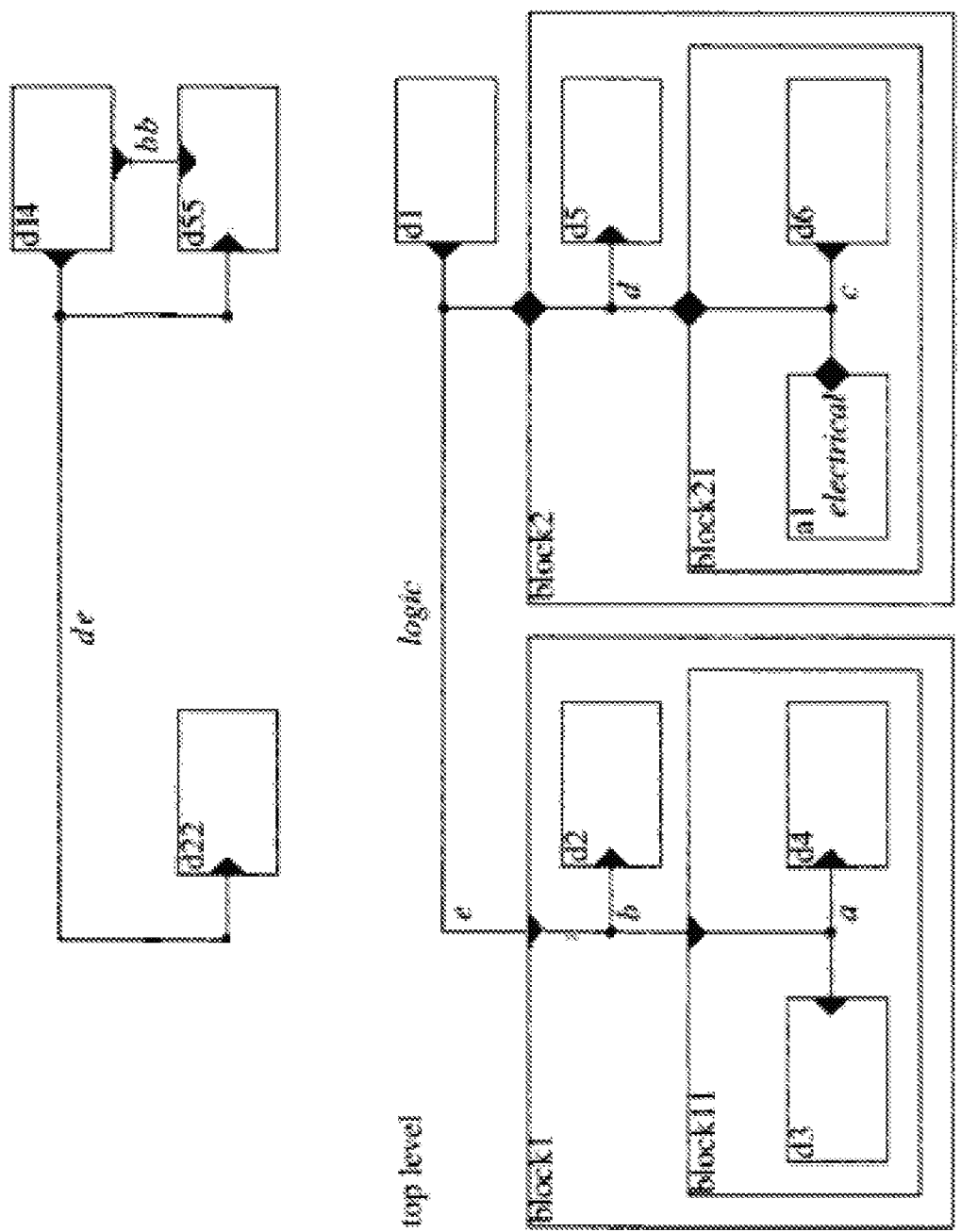

The invasive/auto-coercion approach can be used to address this problem. This approach will automatically coerce signal e in the top level to a discrete discipline such as logic. To explain, first consider how the mixed signal circuit is represented prior to any application of the discipline resolution algorithm, with reference to FIG. 9 using the invasive method.

Figure 10:
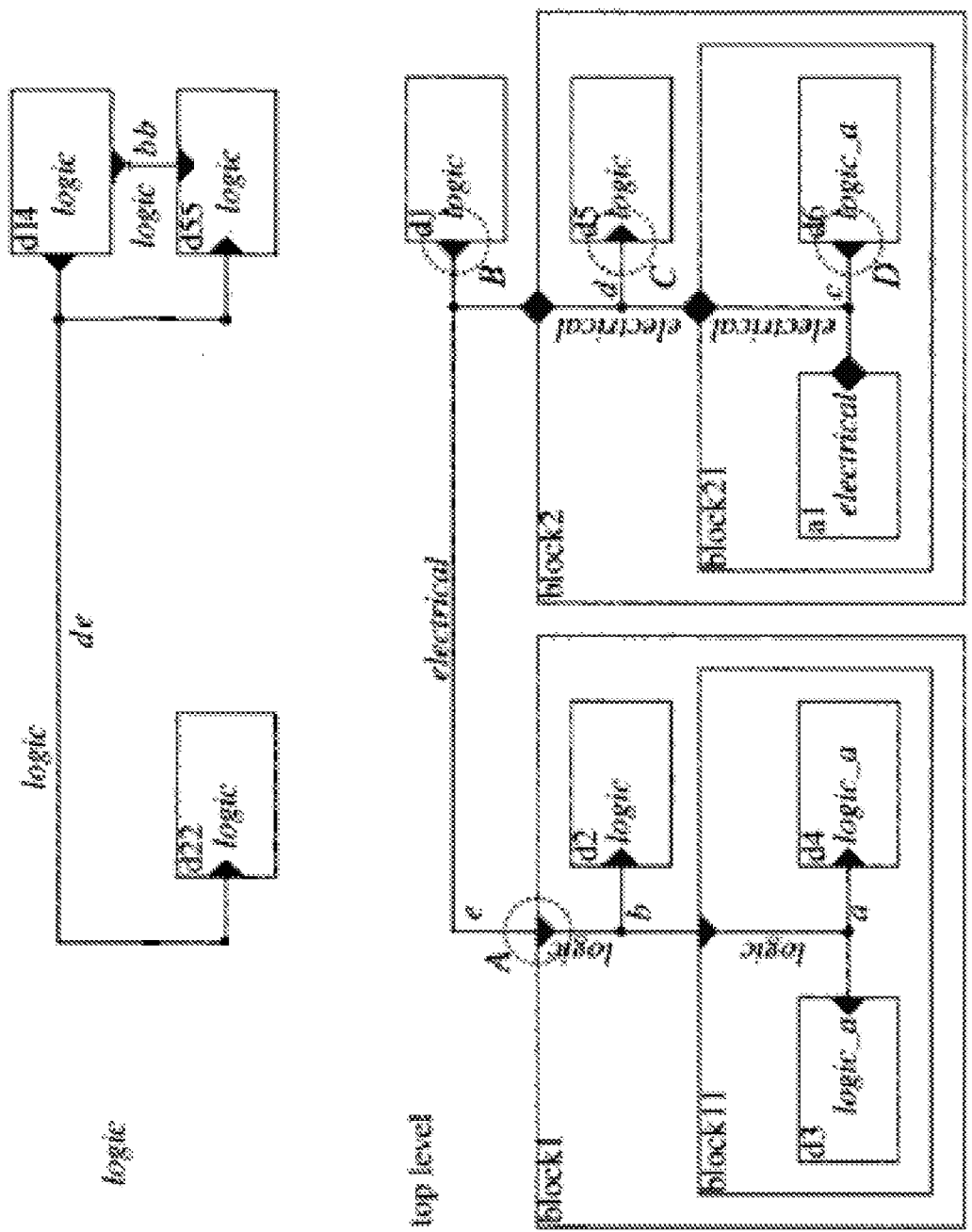

The reason the method is named as "invasive", is that without the auto-coercion method, discipline resolution using the default algorithm would result in an automatic placement of the circled interface elements (which convert from continuous/analog domain to the discrete/digital domain) as shown in FIG. 10. Note that at the output of block d1, a digital-to-analog conversion element "B" is automatically inserted across the output port, which is needed because signal e (without coercion) was resolved to the electrical discipline.

Figure 11:
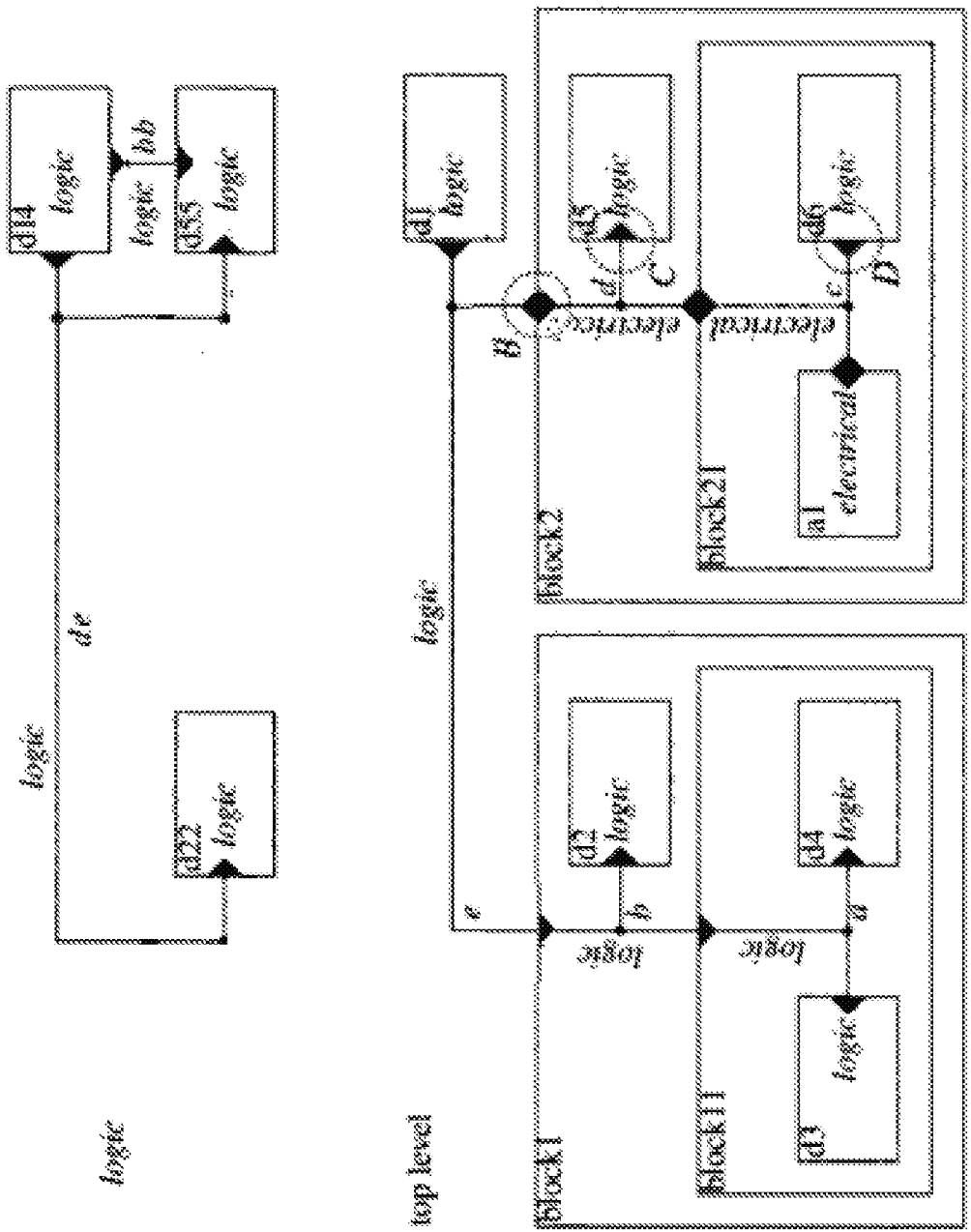

However, with automatic coercion, signal e is forced to the discrete domain (logic discipline), which results in a very different placement of connect module B, as shown in FIG. 11. Further, at this point, connect module A is not required at all. The mere presence of the assertion logic, coupled its associated auto-coercion of signal e, has modified the effective circuit being simulated by the mixed signal simulator, by moving connect module B across the bi-directional (in-out) port of the block 2 and removing connect module A. In some cases this may also subtly change the simulation results; however the changes may be both acceptable and desirable. In other cases, the resulting changes may not be acceptable.

With auto-coercion, the implementation effort is relatively simple, as the auto-coercion essentially takes care of everything. All signals referenced in a digital context within assertion statements are automatically coerced to the discrete domain by assigning them a discrete discipline, and the discipline resolution and conversion module insertion takes care of the rest. For example, a Verilog-AMS discipline can be assigned, and the Verilog-AMS discipline resolution and connect module insertion algorithm are performed to ensure that signal e is always driven with the correct digital (discrete domain) signal representation that corresponds to the electrical port analog/continuous domain signal representation within leaf-level block a1.

However, due to subtle changes in simulation results that may result from the invasive approach, there may in fact be users that want the standard discipline resolution and automatic insertion of connect module process to continue just as it would without the presence of any assert statements. Essentially, even in the presence of the assert statement, such users will still want the discipline resolution and connect module insertion process to give the same result as shown in FIG. 10. Another way of stating this is that such users want assert statements to continue to be able to work (in the purely digital context), while at the same time being guaranteed zero "side affects" which may otherwise affect the discipline resolution and auto connect module insertion algorithms, and further indirectly affect the simulation results as a result.

There can also be situations where the net referenced in the assert statement can be defined in SPICE/transistor level. In this case, the referenced net cannot be coerced to digital. In order to satisfy such users and design configurations, the present embodiments provide for the non-invasive method.

As previously stated, the non-invasive/auto-conversion approach can be taken to implement embodiments of the invention. The non-invasive method does not coerce the signal e to a discrete discipline such as logic, and therefore has no bearing on the results of the Verilog-AMS discipline resolution and connect module insertion algorithm. Instead, the simulator's evaluation engine performs the domain conversion "on-the-fly" only while the assertion statement is being evaluated/updated.

When an assertion (such as {de[=2]; bb} |->e;) is being evaluated, the assertion evaluation code performs a threshold comparison operation, converting the analog signal value e to a logic 1 or 0 as appropriate. This evaluation occurs by comparing the voltage level of the signal to a threshold voltage. Signals with analog values above the high threshold (e.g. vthi) are assigned the value logic 1, and those below the low threshold (e.g. vtlo) are assigned the value logic 0. The threshold comparison operations are performed whenever the assertion statement is being evaluated (e.g. synchronized to a clock signal).

As with the case where Verilog-AMS connect modules support different disciplines and power domains, the present automatic threshold comparison operation will likewise support different disciplines and power domains. Different threshold values can be associated with different parts of the circuit or indeed even different operating conditions such as power mode switches. The mechanism by which different thresholds are specified for different portions of the circuit is outlined below.

Default rules may be configured for assertion re-use. According to some embodiments, by default, the "invasive" (auto-coercion) approach will be applied for assert re-use. As previously noted, any domainless net/signal specified in assert statement will be automatically coerced to digital domain. The discipline of the coerced digital net will be determined, e.g., using the standard set of protocols defined by Verilog-AMS. Connect modules will be inserted across digital/analog boundaries, e.g., using the standard set of protocols defined by Verilog-AMS. The Connect Modules are also referred to herein as "Interface Elements" or "ie".

The following is an example control block specification describing an illustrative format that that may be used to specify interface elements for a mixed-signal design:

```
amsd {
...
// some interface element rules for standard connect modules
ie vsup=1.8 discipline=logic1_8v //global setting
ie vsup=3 lib=lib_core vthi=3 vtlo=1 rlo=250 discipline=logic3v
ie vsup=5 lib=lib_pad vthi=5 vtlo=2 rlo=100 discipline=logic5v
ie vsup=3 cellport="bandgap.port1 bandgap.port3"
discipline=logic3v
...
}
```

In this example, discipline "logic1_8v" is the default global discipline associated with any scope outside the ones which are specified using the ie card statement in the control block(s).

The discipline "logic3v" is to be associated with any signals referenced in any assert statements contained within the library scope of "lib_core". This discipline establishes a vthi threshold of 3V for the logic 1 value and vtlo threshold of 1V for the logic 0 value. A resistance parameter rlo for the discipline can also be set in this control block. Similarly, the discipline "logic5v" is to be associated with any signals referenced in any assert statements contained within the library scope of "lib_pad", which also establishes vthi and vtlo thresholds for the discipline. The last line above in the control block demonstrates that parameters can be set for specific cells/blocks within a library. More details regarding an approach for implementing control blocks according to some embodiments is described in co-pending U.S. patent application Ser. No. 12/399,855, filed on Mar. 6, 2009, which is hereby incorporated by reference in its entirety.

The following is an example SystemVerilog property definition and assert statement:

```
property P1 (wire A, B, Enable=1)
    @(posedge clk)
        Enable -> (B ##1 c) |=> (A ##[1:2] (d || A));
Endproperty
assert_P1: assert property P1(.A(core.core_A), .B(pad.pad_B));
```

In this example, the assert statement instantiates property P1 passing the actual signal 'core_A' from cell 'core' of library 'lib_core' and the signal 'pad_B' from cell 'pad' of library 'lib_pad'. As these two signals were used in an assert statement, they will be automatically coerced to digital domain, irrespective of whether they are connected to analog blocks or not. If the nets are defined in SPICE/transistor level, an error message will be reported.

The discipline of signals 'core_A' and 'pad_B' will be determined based on the ie card specifications in the control block. In this case, 'core_A' will be assigned the discipline 'logic3v' while 'pad_B' will be assigned the discipline logic5v'.

After the disciplines are assigned, ie insertion will be used to insert appropriate connect modules in the design, e.g., based upon Verilog-AMS standard rules and any applicable proprietary rules and technologies that may be used in conjunction with the invention.

Therefore, in the invasive approach, discipline coercion will happen automatically as previously described, and appropriate connect modules will be inserted take care of domain conversation. Any wires (such de, bb, and e as in the above example) in the design which have not been explicitly assigned a discipline or used in a non-assert context in which the discipline is implicitly and unambiguously defined, but which are referenced in a digital context via assertion statements, will be governed by rules as described above. The main approach is to implicitly but directly associate a discrete discipline with the relevant signals via a discipline coercion method.

User-defined rules may also be employed for assertion re-use. In this approach, the user can override the default rules for the invasive approach specified above. Instead, the user can modify the control to specify the non-invasive/auto-conversion approach. The following is an example control block specification describing an illustrative format that that may be used to specify the non-invasive/auto-conversion approach:

```
amsd {
    // some interface element rules for standard connect modules
    ie vsup=3 lib=lib_core vthi=3 vtlo=1 rlo=250 discipline=logic3v
    ie vsup=5 lib=lib_pad vthi=5 vtlo=2 rlo=100 discipline=logic5v
    ie vsup=3 cellport="bandgap.port1 bandgap.port3"
    discipline=logic3v
    // the lightweight, non-invasive kind - cf a.k.a conversion
    function
    cf cell=top vthi=0.6 vtlo=0.4
    ...
}
```

The above cf statement specifies that the scope of the statement is directed to a cell named "top", and that the vthi threshold for performing conversions to the logical high or "1" value is 0.6V and the vtlo threshold for performing conversions to the logical low or "0" value is 0.4V.

The syntax of 'cf' card in this control block is just one example of the many ways in which the conversion function can be specified. Other user input mechanisms may also be used to specify the same kind of information. It is noted that the specification can also include a user-defined conversion function. For example, "cf cell=top function=fast_a2d" can be specified where "fast_a2d" is a user-defined function described in a language like Verilog-AMS.

Consider the same example of SystemVerilog property definition and assert statement that was presented above:

```
property P1 (wire A, B, Enable=1)
    @(posedge clk)
        Enable -> (B ##1 c) |=> (A ##[1:2] (d || A));
Endproperty
assert_P1: assert property P1(.A(core.core_A), .B(pad.pad_B));
```

In the above example, the assert statement instantiates property P1 passing the actual signal 'core_A' from cell 'core' of library 'lib_core' and the signal 'pad_B' from cell 'pad' of library 'lib_pad'. Although these two signals were used in an assert statement, they will not be automatically coerced to digital domain. Instead, the standard Verilog-AMS rules for discipline resolution and any applicable proprietary algorithms for discipline resolution will be applied on the net to determine the domain and discipline of the net. If a digital discipline is assigned to the net, no further conversions are required for processing that net in the assert statement. If, however, an analog discipline is assigned to the net, then, a suitable conversion function will be applied to that net in the assert statement based on the specifications in the control block. The example shows how the non-invasive kind of signal conversion can be configured using a conversion function, e.g., as follows for 'cf' card:

```
// the lightweight, non-invasive kind conversion function a.k.a
'cf'
cf cell=top vthi=0.6 vtlo=0.4
```

In this example, assume that signals 'core_A' and 'pad_B' are either connected to SPICE or defined in SPICE, e.g., they are assigned an analog discipline. As they are used in the assert statement, the value of those nets will be converted from analog to digital on-the-fly and only when they are needed, by the evaluation of the assert statement itself, without affecting any of the rest of the design. The conversion will be performed simply by comparing the analog signal value with the specified threshold(s). Again, multiple such statements can allow for different hard-coded thresholds to be used for different scoped blocks in the design, to account for different power domains and supply voltages.

Regarding the scope of assertion re-use, it is possible that assertion statements can be constructed using many different kinds of constructs and in many contexts. The concept of accessing objects with either an analog or continuous domain representation within a digital context of an assertion is now explained with respect to examples. The following are some examples of the ways in which assertion statements can be built up from simple Boolean operations/expressions to sequences to sequences of sequences to properties containing sequences of sequences, to finally use of the property in an assertion statement a1.

The following example includes illustrative statements for a Boolean statement, sequence definition, property definition, and verification directive:

```
-- BOOLEAN LAYER
    ! (rd && wr); -- rd, wr are design signals.

-- TEMPORAL LAYER
-- Sequence definition
sequence s1 = {pkt_sop; (! pkt_xfer_en_n [*1 to 100]); pkt_eop};
sequence s2 = {pkt_sop; (! pkt_xfer_en_n [*1 to 100]};
pkt_aborted};
-- In s1 and s2, the individual sequence elements (such as
pkt_sop,
-- pkt_xfer_en_n etc.) are design signals.
-- Property definition
property p1 = reset_cycle_ended |=> (s1; s2};
-- Property p1 uses previously defined sequences s1 and s2.
-- VERIFICATION LAYER
a1 : assert p1;
```

In the above example, all signals such as rd, wr, pkt_sop, pkt_xfer_en_n, pck_eop, pkt_aborted, reset_cyle_ended are design signals. Considering signal pkt_sop in particular, it can be seen that it is referenced within both sequences s1 and s2. Those sequences in turn are referenced within property p1, and finally property p1 is referenced in the assert statement. This means that signal pck_sop is also referenced by the assert statement a1, and so is eligible for discipline coercion using the prescribed method; the fact that the assertion is broken down into subcomponents such as properties and sequences doesn't exclude them, since eventually they are considered anyway. In the above example, while signal reset_cycle_ended is not referenced in a sequence explicitly, it is still referenced in a Boolean layer context within the property p1. It is therefore equally eligible.

The above examples are with respect to PSL. An example below follows with respect to SystemVerilog Assertions (SVA):

```
module top(input bit clk);
logic a,b,c;
property rule3;
@(posedge clk) a |-> b ##1 c;
endproperty
a1: assert property (rule3);
...
endmodule
```

Again, the same principle applies, and signals a,b,c are all considered as being in a "digital context" by virtue of how they are used within an assert, even though the property rule exists as an extra level of abstraction in creating the assert statement itself.

The following procedure describes how to detect a signal in an assert statement according to some embodiments of the invention.

For every assert statement in the design, a determination is made whether or not it is a simple boolean assert. If so, then every signal referenced in the simple boolean assert is identified or marked as referenced signal.

If the assert statement is a complex assert, such as a sequence declaration or instantiation, then a further determination is made whether a signal or simple boolean expression is referenced in the sequence. If so, then processing is returned back to the actions of the previous paragraph to process the signals in the expression. If, however, another sequence is referenced in the sequence declaration, then the new sequence in the assert statement is identified or marked a as "referenced sequence". The processing then returns back to the beginning of the actions specified at the beginning of this paragraph and the "referenced sequence" is recursively processed.

Else, a determination is made whether the statement is a property definition. If so, then the property definition or instantiation is processed by further checking whether a signal or simple boolean expression is referenced in the property definition. If so, then the processing returns back to the actions of the earliuer paragraph pertaining to a determination of a Boolean assert to process the signals in the expression.

If a sequence is referenced in the property definition, then the new sequence is identified or otherwise marked in the assert statement as "referenced sequence". Processing then returns back to the actions of the paragraph above pertaining to the referenced sequence to process the "referenced sequence" recursively.

If another property is referenced in the property definition, then the property in the assert statement is identified or otherwise marked as "referenced property". Processing then returns back to the actions of the paragraph above pertaining to whether the statement is a property definition to process the "referenced property" recursively.

Else, if the statement is a verification directive, then the process handles the verification directive by making a determination whether a signal or simple boolean expression is referenced in the verification directive. If so, then the processing returns back to the actions of the paragraph above pertaining to a determination of a Boolean assert to process the signals in the expression.

If a sequence is referenced in the property definition, then the new sequence is identified or otherwise marked in the assert statement as "referenced sequence". Processing then returns back to the actions of the paragraph above pertaining to the referenced sequence to process the "referenced sequence" recursively.

If a property is referenced in the verification directive, then the property in the assert statement is identified or otherwise marked as a "referenced property". Processing then returns back to the actions of the paragraph above pertaining to whether the statement is a property definition to process the "referenced property" recursively.

The present invention can be configured to handle Out of Module References (OOMRS). Objects are usually locally defined and referenced in a design component (for example, a Verilog module). However, sometimes, there are hierarchical references which may not be locally defined. Instead, those references are made remotely.

OOMRS can be referenced within the Boolean layer of assertion statements, as in the following example:

```
module top(input bit clk);
logic a,b;
property rule3;
@(posedge clk) a |-> b ##1 top.i1.i2.c;
endproperty
a1: assert property (rule3);
...
endmodule
```

In the above example, signal top.$i1.i2.c$ is referenced via an Out of Module Reference (OOMR) which allows the assertion to transcend hierarchy. Such OOMR references will be treated in the same manner as regular signals during the elaboration process. In the invasive method, the above reference to top.$i1.i2.c$ in the rule3 property will be equivalent to an OOMR discipline declaration within module top such as logic top.$i1.i2.c$;

where logic is a discrete discipline that would have been assigned based on rules described earlier in this document.

Therefore, what has been described is an improved approach that allows re-use of digital assertions in the context of mixed-signal simulation and methodology. Some of the key aspects of embodiments of this invention include:

Modeling Language Standard Compliance: The invention is designed within the scope of the HDL semantics and do not break any language semantics. This feature makes this approach attractive to designers since they are not led to writing any customized models/libraries for a single solution.

Pure Digital and Mixed-Signal Simulation Mode Compliance: The invention allows re-usage of digital assertions statements without needing any manual changes in the digital code/libraries. This is a tremendous value to designers and CAD groups since their digital models and libraries can be seamlessly re-used in a mixed-signal design and can be readily simulated.

Usability: The invention allows for a full user control in interpretating the assertions based on invasive vs. Non-invasive approaches without needing any actual model/assertion statement changes. Users can re-use the digital model as-is and change the interpretation of assertions based on the external configuration files (as explained earlier in the flow). The user can also exercise a full control over how analog values are converted to digital for assertion processing.

First of its kind: There are no available solution according to the current art that addresses the need for digital assertion re-use in the mixed-signal simulation and methodologies.

Extensibility: The concept of digital assertion re-use can be extended to work for assertion written in any languages under any scopes.

System Architecture Overview

Figure 12:
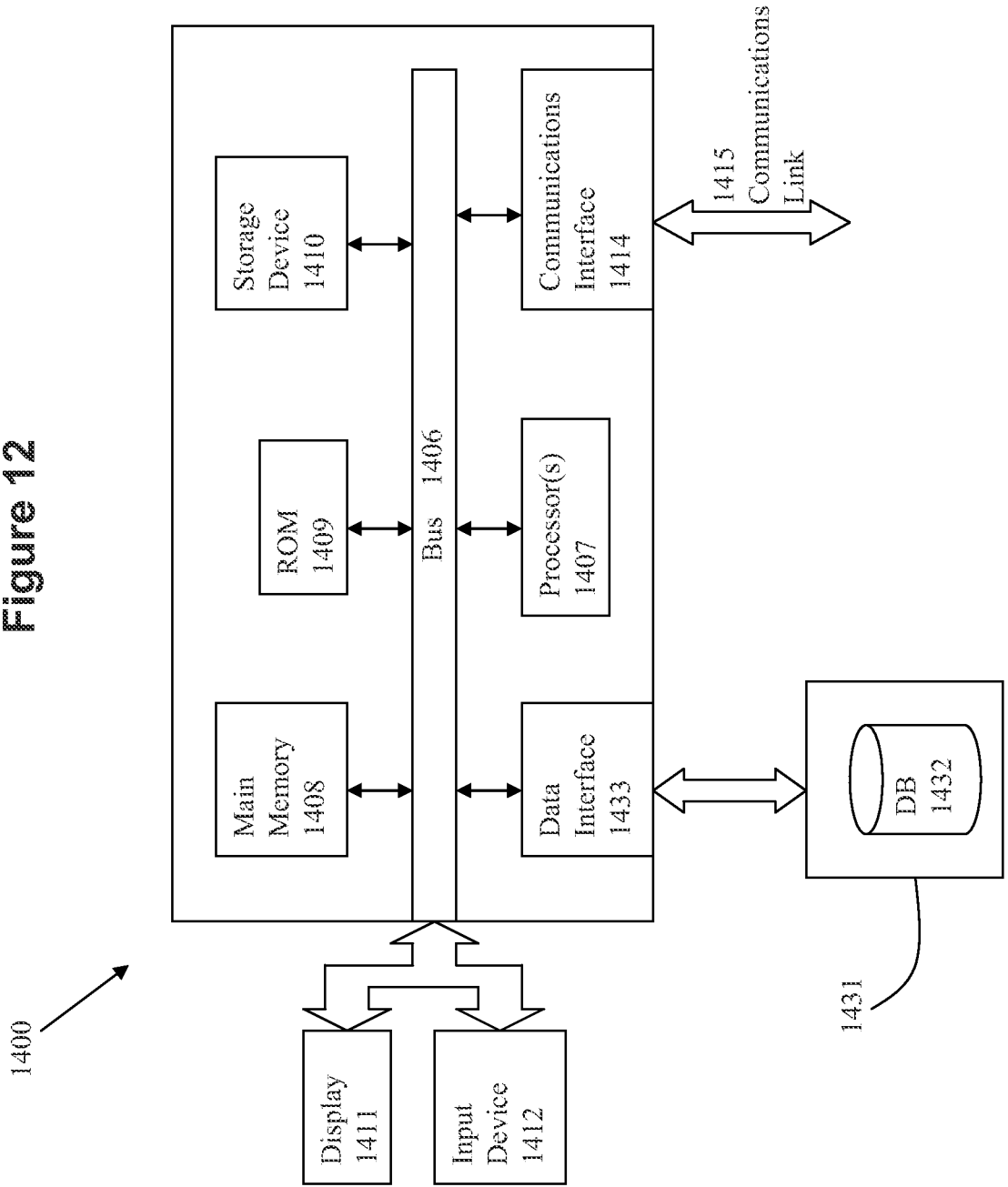
FIG. 12 depicts a computerized system on which a method for re-using digital assertions in a mixed signal context can be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for re-using digital assertions, comprising:
    receiving an electronic design having a digital assertion that is being re-used in conjunction with one or more analog components such that the electronic design is a mixed signal design comprising both analog and digital portions;
    using a computer processor to generate signal data that interfaces with the digital assertion such that the signal data is digital in nature even if the signal data originates from an analog component; and
    wherein the digital assertion is used during verification of the electronic design to perform a check upon one or more portions of the electronic design,
    wherein the digital assertion comprises at least one statement of logic that is implemented by code.

2. The method of claim 1 in which auto-coercion is performed to generate the signal data in digital form.

3. The method of claim 2 in which the auto-coercion is performed by typecasting the signal data into the digital form.

4. The method of claim 2 in which the auto-coercion is performed using a connect module in a Verilog-based or Verilog-variant language.

5. The method of claim 1 in which auto-conversion is performed to generate the signal data in digital form.

6. The method of claim 5 in which the auto-conversion is performed on-the-fly when the digital assertion is being evaluated.

7. The method of claim 1 in which rules are established to guide generation of the signal data.

8. The method of claim 7 in which the rules comprise at least one default rule and user-generated rules.

9. The method of claim 1 in which the signal data is generated by a process comprising identifying signals referenced by the digital assertion, determining a discipline associated with the signals, and implementing modules or conversion processes based upon the discipline.

10. The method of claim 9 in which the modules or conversion processes establish voltage thresholds for determining the digital nature of an analog signal.

11. A computer program product embodied on a non transitory computer readable storage medium, the non transitory computer readable storage medium having stored thereon a sequence of instructions which, when executed by a processor causes the processor to execute a method for re-using digital assertions, the method comprising:
    receiving an electronic design having a digital assertion that is being re-used in conjunction with one or more analog components such that the electronic design is a mixed signal design comprising both analog and digital portions;
    using a computer processor to generate signal data that interfaces with the digital assertion such that the signal data is digital in nature even if the signal data originates from an analog component; and
    wherein the digital assertion is used during verification of the electronic design to perform a check upon one or more portions of the electronic design,
    wherein the digital assertion comprises at least one statement of logic that is implemented by code.

12. The computer program product of claim 11 in which auto-coercion is performed to generate the signal data in digital form.

13. The computer program product of claim 12 in which the auto-coercion is performed by typecasting the signal data into the digital form.

14. The computer program product of claim 12 in which the auto-coercion is performed using a connect module in a Verilog-based or Verilog-variant language.

15. The computer program product of claim 11 in which auto-conversion is performed to generate the signal data in digital form.

16. The computer program product of claim 15 in which the auto-conversion is performed on-the-fly when the digital assertion is being evaluated.

17. The computer program product of claim 11 in which rules are established to guide generation of the signal data.

18. The computer program product of claim 17 in which the rules comprise at least one default rule and user-generated rules.

19. The computer program product of claim 11 in which the signal data is generated by a process comprising identifying signals referenced by the digital assertion, determining a discipline associated with the signals, and implementing modules or conversion processes based upon the discipline.

20. The computer program product of claim 19 in which the modules or conversion processes establish voltage thresholds for determining the digital nature of an analog signal.

21. A computer-based system for re-using digital assertions, comprising:
a computer processor to execute a set of program code instructions;
a memory to hold the program code instructions, in which the program code instructions comprises program code to receive an electronic design having a digital assertion that is being re-used in conjunction with one or more analog components such that the electronic design is a mixed signal design comprising both analog and digital portions, to use the computer processor to generate signal data that interfaces with the digital assertion such that the signal data is digital in nature even if the signal data originates from an analog component, and wherein the digital assertion is used during verification of the electronic design to perform a check upon one or more portions of the electronic design, wherein the digital assertion comprises at least one statement of logic that is implemented by code.

22. The system of claim 21 in which auto-coercion is performed to generate the signal data in digital form.

23. The system of claim 22 in which the auto-coercion is performed by typecasting the signal data into the digital form.

24. The system of claim 22 in which the auto-coercion is performed using a connect module in a Verilog-based or Verilog-variant language.

25. The system of claim 21 in which auto-conversion is performed to generate the signal data in digital form.

26. The system of claim 25 in which the auto-conversion is performed on-the-fly when the digital assertion is being evaluated.

27. The system of claim 21 in which rules are established to guide generation of the signal data.

28. The system of claim 27 in which the rules comprise at least one default rule and user-generated rules.

29. The system of claim 21 in which the signal data is generated by a process comprising identifying signals referenced by the digital assertion, determining a discipline associated with the signals, and implementing modules or conversion processes based upon the discipline.

30. The system of claim 29 in which the modules or conversion processes establish voltage thresholds for determining the digital nature of an analog signal.

\* \* \* \* \*